United States Patent [19]

Lee

[11] Patent Number: 6,078,081
[45] Date of Patent: Jun. 20, 2000

[54] SEMICONDUCTOR DEVICE FOR IMPROVING SHORT CHANNEL EFFECT

[75] Inventor: Sang Don Lee, Chungcheongbuk-do, Rep. of Korea

[73] Assignee: LG Semicon Co., Ltd., Chungcheongbuk-Do, Rep. of Korea

[21] Appl. No.: 09/326,694

[22] Filed: Jun. 7, 1999

Related U.S. Application Data

[62] Division of application No. 09/057,537, Apr. 9, 1998, Pat. No. 5,937,293.

[30] Foreign Application Priority Data

May 28, 1997 [KR] Rep. of Korea .................. 97-21319

[51] Int. Cl.⁷ ..................... H01L 29/76; H01L 29/94; H01L 31/113
[52] U.S. Cl. ..................... 257/344; 257/345; 257/404; 257/408
[58] Field of Search ..................... 257/344, 347, 257/336, 404, 408, 345

[56] References Cited

U.S. PATENT DOCUMENTS

| | | | |
|---|---|---|---|
| 5,166,765 | 11/1992 | Lee et al. .................. | 257/345 |
| 5,449,937 | 9/1995 | Arimura et al. .................. | 257/345 |
| 5,532,508 | 7/1996 | Kaneko et al. .................. | 257/336 |
| 5,675,166 | 10/1997 | Ilderem et al. .................. | 257/345 |
| 5,712,503 | 1/1998 | Kim et al. .................. | 257/345 |
| 5,719,424 | 2/1998 | Ahmad et al. .................. | 257/336 |
| 5,811,340 | 9/1998 | Park .................. | 438/291 |
| 5,903,029 | 5/1999 | Hayashida et al. .................. | 257/344 |

*Primary Examiner*—Donald L. Monin, Jr.
*Attorney, Agent, or Firm*—Morgan, Lewis & Bockius LLP

[57] ABSTRACT

Disclosed are a semiconductor device and a method for fabricating the same which improve short channel effect and increase current driving force. The semiconductor device includes a first conductivity type semiconductor substrate, a gate electrode formed on the semiconductor substrate, a sidewall insulating film formed at both sides of the gate electrode, a second conductivity type first lightly doped impurity region and a second conductivity type second heavily doped impurity region formed in the semiconductor substrate at both sides of the gate electrode, a first conductivity type first impurity region for surrounding the second conductivity type first impurity region, and a first conductivity type second impurity region for surrounding the second conductivity type second impurity region.

5 Claims, 6 Drawing Sheets

6,078,081

1

SEMICONDUCTOR DEVICE FOR IMPROVING SHORT CHANNEL EFFECT

This is divisional of Application Ser. No. 09/057,537 filed on Apr. 9, 1998, now U.S. Pat. No. 5,437,293.

BACKGROUND OF THE INVENTION

1. Field of the Invention

The present invention relates to a semiconductor device, and more particularly, to a method for fabricating a semiconductor device which improves short channel effect and increases current driving force.

2. Discussion of the Related Art

A conventional semiconductor device and a method for fabricating the same will be described with reference to the accompanying drawings.

FIG. 1 is a schematic view illustrating a conventional semiconductor device. FIG. 2a to FIG. 2d are sectional views illustrating process steps of a method for fabricating a conventional semiconductor device.

As shown in FIG. 1, a gate oxide film 3, a gate electrode 4, and a gate cap insulating film 5 are stacked on a predetermined region of a semiconductor substrate 1. A sidewall insulating film 9 is formed at both sides of the gate oxide film 3, the gate electrode 4, and the gate cap insulating film 5. A lightly doped drain (LDD) region 8 is formed in the semiconductor substrate 1 at both sides of the gate electrode 4. A second halo region 7 is formed at the same depth as the LDD region 8 to surround the LDD region 8. A source/drain region 10 is formed in the semiconductor substrate 1 at both sides of the sidewall insulating film 9. A first halo region 6 is formed in the semiconductor substrate at both sides of the gate electrode 4. The second halo region 7 has a width wider than that of the first halo region 6 and has a depth lower than that of the first halo region 6. These halo regions 7 and 8 overlap each other at a lower edge portion of the LDD region 8.

The method for fabricating the conventional semiconductor device will be described with reference to FIG. 2a to FIG. 2d.

As shown in FIG. 2a, an active region and a field region are defined in a P type semiconductor substrate 1 to form a field oxide film 2 in the field region. A first oxide film, a polysilicon, and a second oxide film are sequentially deposited on an entire surface of the semiconductor substrate 1 and then removed by anisotropic etching process to form a gate oxide film 3, a gate electrode 4, and a gate cap insulating film 5.

P type impurity ions are tilt implanted into the semiconductor substrate 1 at both sides of the gate electrode 4 at an angle between 7° and 20° to form a first halo region 6.

As shown in FIG. 2b, P type impurity ions are implanted into the semiconductor substrate 1 at both sides of the gate electrode 4 at an angle between 30° and 60° to form a second halo region 7. At this time, the second halo region 7 has a width wider than that of the first halo region 6 and has a depth lower than that of the first halo region 6.

As shown in FIG. 2c, N type lightly doped impurity ions are implanted into the semiconductor substrate 1 at both sides of the gate electrode 4 to form an LDD region 8.

As shown in FIG. 2d, an oxide film is deposited on the entire surface of the semiconductor substrate 1 by chemical vapor deposition (CVD) and etched back to form a sidewall insulating film 9 at both sides of the gate electrode 4. N type heavily doped impurity ions are implanted into the semiconductor substrate 1 using the gate electrode 4 and the sidewall insulating film 9 as masks to form a source/drain region 10.

At this time, the first halo region 6 has almost the same depth as that of the source and drain region 10. The second halo region 7 has almost the same depth as that of the LDD region 8. As a result, short channel effect can be improved.

However, the conventional semiconductor device and the method for fabricating the same have several problems.

In the conventional method for fabricating the semiconductor device, the halo region is formed by two times ion implantation processes to improve threshold voltage and short channel effect as well as to adjust breakdown voltage characteristic. This results in that the depth of the ions implanted becomes lower in high integrated device of submicron or less. As a result, the first halo region and the second halo region overlap each other.

The first halo region requires heavily doped impurity ions to adjust breakdown voltage, as the length of the channel becomes shorter in the high integrated device. This results in that the doping density becomes heavier at the portion where the first halo region and the second halo region overlap each other and that the threshold voltage increases at the portion where the doping density is heavy. As a result, it is difficult to adjust operational characteristic of the device.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same which improve short channel effect and current driving force.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor device according to the present invention includes a first conductivity type semiconductor substrate, a gate electrode formed on the semiconductor substrate, a sidewall insulating film formed at both sides of the gate electrode, a second conductivity type first lightly doped impurity region and a second conductivity type second heavily doped impurity region formed in the semiconductor substrate at both sides of the gate electrode, a first conductivity type first impurity region for surrounding the second conductivity type first impurity region, and a first conductivity type second impurity region for surrounding the second conductivity type second impurity region.

In another aspect, a method for fabricating a semiconductor device according to the present invention includes the steps of forming a gate electrode on a first conductivity type semiconductor substrate, forming a second conductivity type first lightly doped impurity region in the semiconductor substrate at both sides of the gate electrode, forming a first conductivity type first impurity region surrounding the second conductivity type first lightly doped impurity region, forming a sidewall insulating film at both sides of the gate electrode, forming a second conductivity type second heavily doped impurity region in the semiconductor substrate at both sides of the sidewall insulating film, and forming a first conductivity type second impurity region surrounding the second conductivity type second heavily doped impurity region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
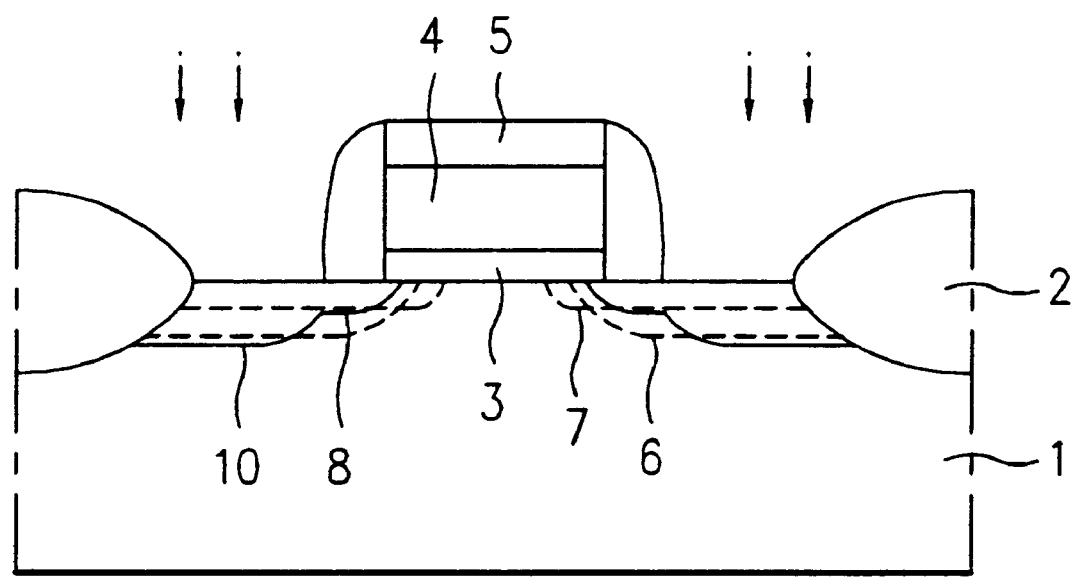
FIG. 1 is a schematic view illustrating a conventional semiconductor device.
Figure 2A:
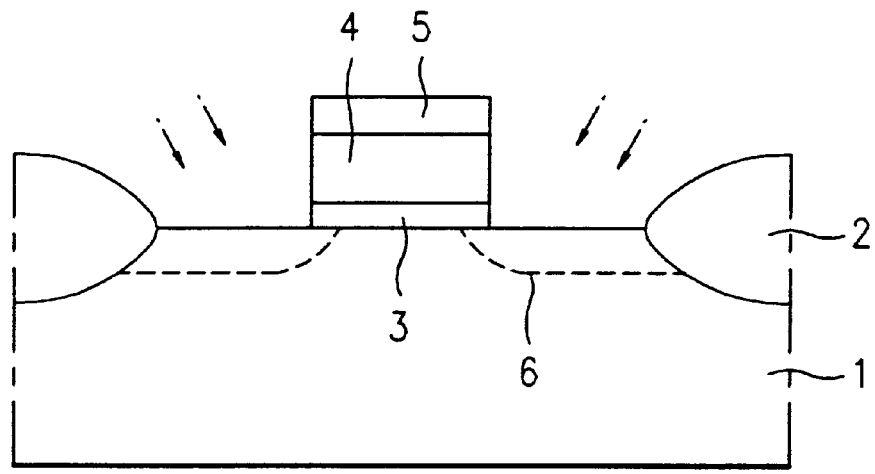
FIG. 2a to FIG. 2d are sectional views illustrating a method for fabricating a conventional semiconductor device.
Figure 2B:
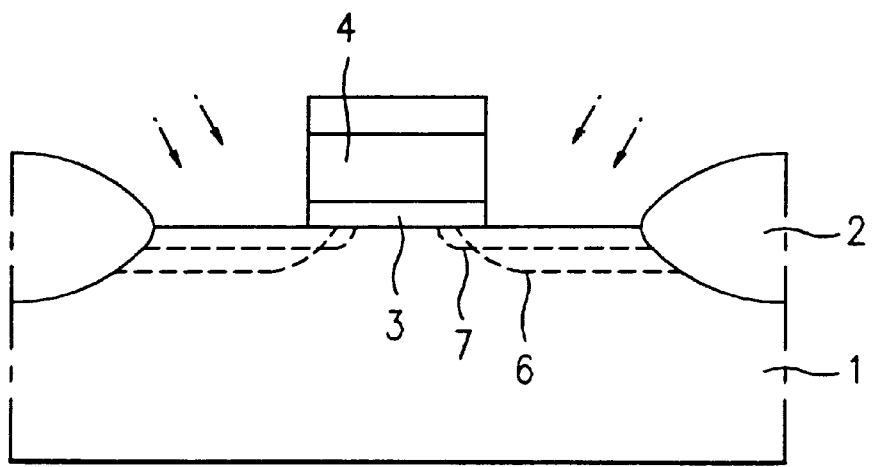
Figure 2C:
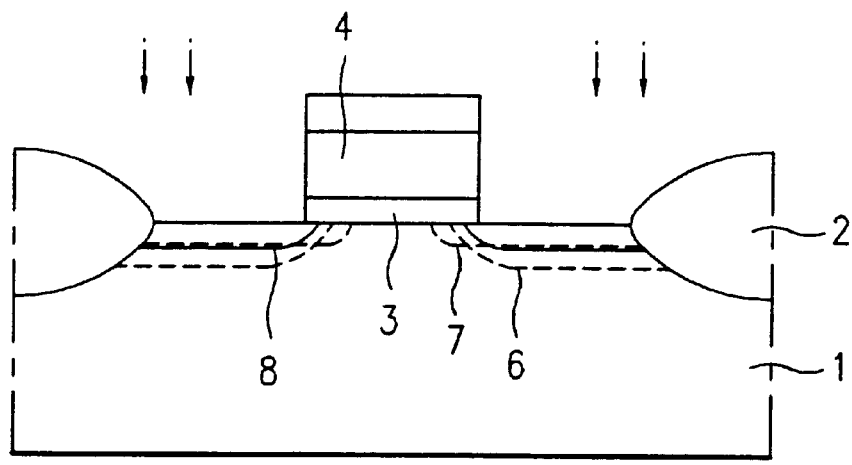
Figure 2D:
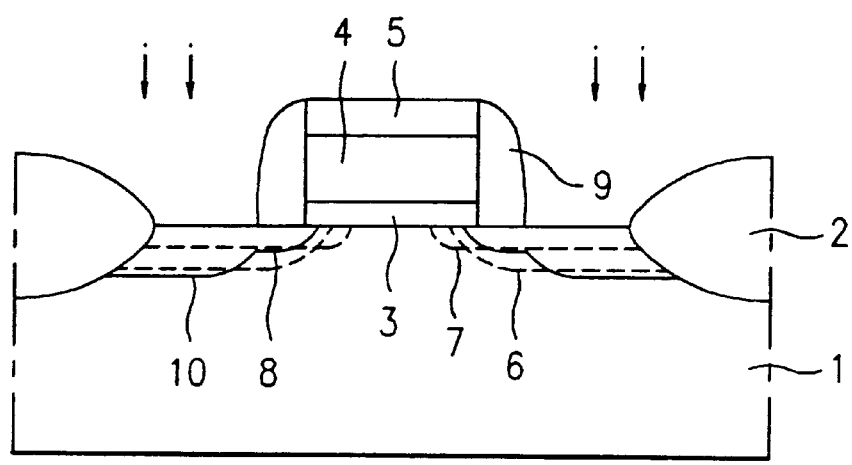
Figure 3:
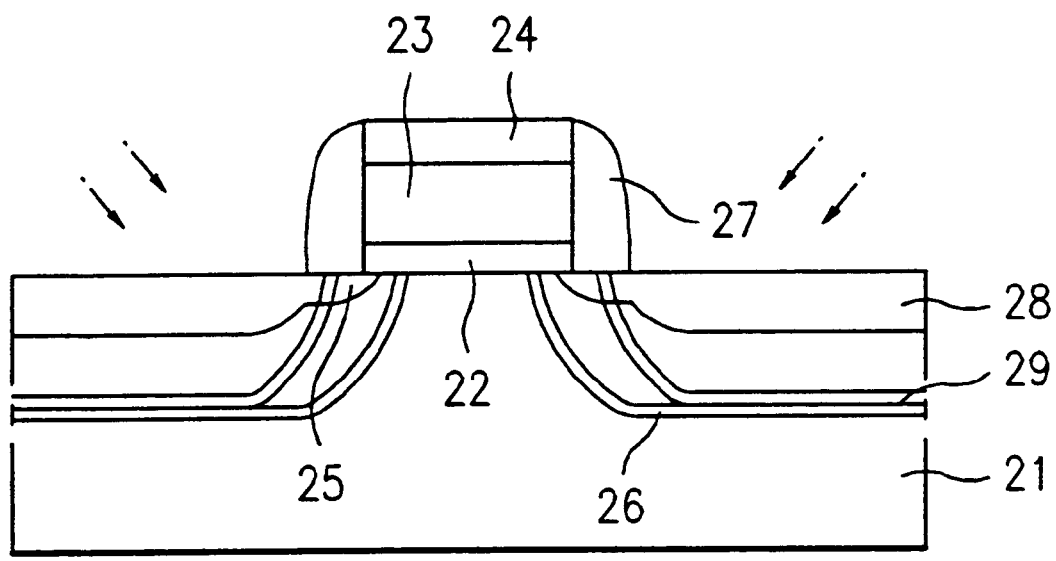
FIG. 3 is a schematic view illustrating a semiconductor device according to the present invention.

As shown in FIG. 3, a gate oxide film 22, a gate electrode 23, and a gate cap insulating film 24 are sequentially stacked on a predetermined region of a semiconductor substrate 21. An N type LDD region 25 is formed in the semiconductor substrate 21 at both sides of the gate electrode 23. A P type first halo region 26 is formed in the semiconductor substrate 21 at both sides of the gate electrode 23 to surround the N type LDD region 25. A sidewall insulating film 27 is formed at both sides of the gate oxide film 22, the gate electrode 23, and the gate cap insulating film 24.

An N type source/drain region 28 is formed in the semiconductor substrate 21 at both sides of the sidewall insulating film 27 excluding a lower portion of the gate electrode 23. A second halo region 29 is formed to surround the N type source/drain region 28 and the N type LDD region 25 excluding a lower edge portion of the N type LDD region 25. The N type LDD region 25 extends below the gate electrode 23 to be longer than the N type source/drain region 28.

A method for fabricating the semiconductor device according to the present invention will be described with reference to FIG. 4a to FIG. 4f.

Figure 4A:
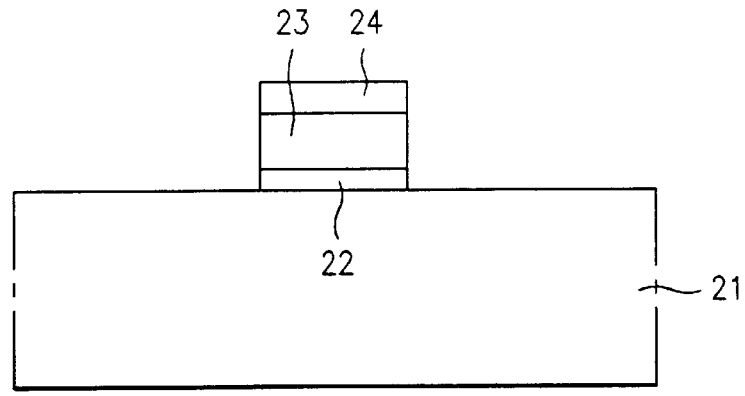
FIG. 4a to FIG. 4f are sectional views illustrating a method for fabricating a semiconductor device according to the present invention.

As shown in FIG. 4a, ions for adjustment of threshold voltage are implanted into the P type semiconductor substrate 21 and then ions for punch through stop are implanted into the same.

Thereafter, an oxide film, a polysilicon, and an insulating film are sequentially deposited on the semiconductor substrate by CVD.

Subsequently, a photoresist is deposited on an entire surface of the semiconductor substrate and selectively patterned by exposure and developing processes (not shown).

The first oxide film, the polysilicon, and the second oxide film are sequentially etched by anisotropic etching process using the patterned photoresist as a mask so that the gate oxide film 22, the gate electrode 23, and the gate cap insulating film 24 are formed in a predetermined region of the semiconductor substrate. At this time, the gate cap insulating film 24 may not be formed.

The gate electrode 23 may be formed of any one of metal, polysilicon, and silicide. Alternatively, the gate electrode 23 may be formed of dual structure of silicide and metal. The gate electrode 23 may also be formed of triple structure of polysilicon, metal, and silicide.

Figure 4B:
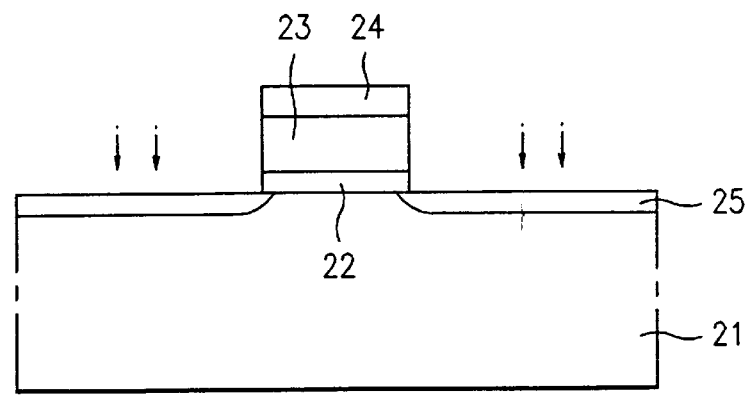

As shown in FIG. 4b, N type lightly doped impurity ions are implanted into the P type semiconductor substrate 21 at both sides of the gate electrode 23 to form an LDD region 25.

Figure 4C:
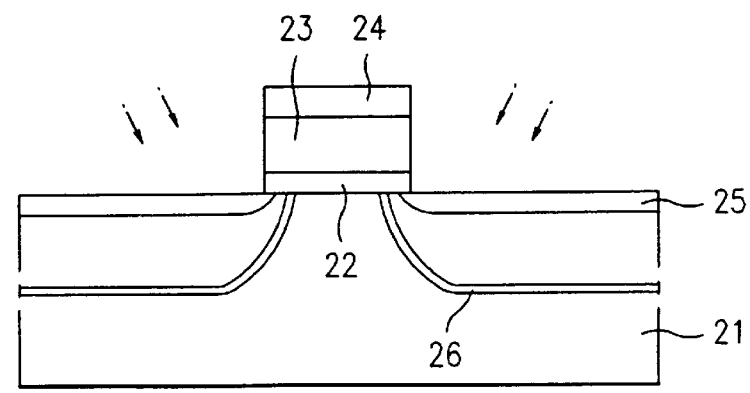

As shown in FIG. 4c, P type impurity ions are tilt implanted into the P type semiconductor substrate 21 at both sides of the gate electrode at an angle between 0° and 60° to form a first halo region 26. The first halo region 26 is formed to surround a lower edge portion of the LDD region 25 at both sides of the gate electrode 23.

Figure 4D:
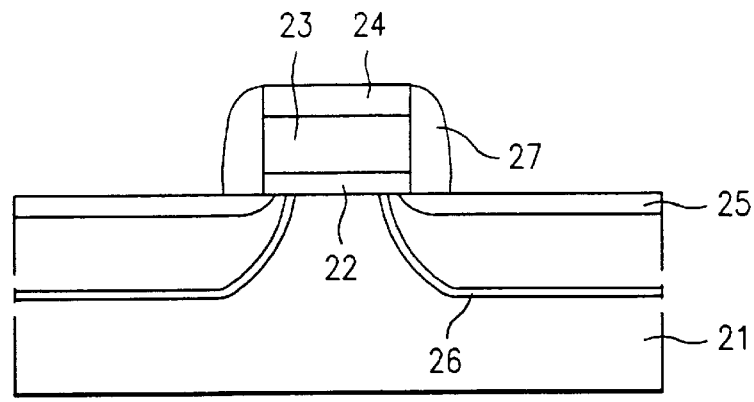

As shown in FIG. 4d, the insulating film is deposited on the entire surface of the semiconductor substrate by CVD and etched by anisotropic etching process to form a sidewall insulating film 27. At this time, the sidewall insulating film 27 may be formed of either thermal oxide or polysilicon.

Figure 4E:
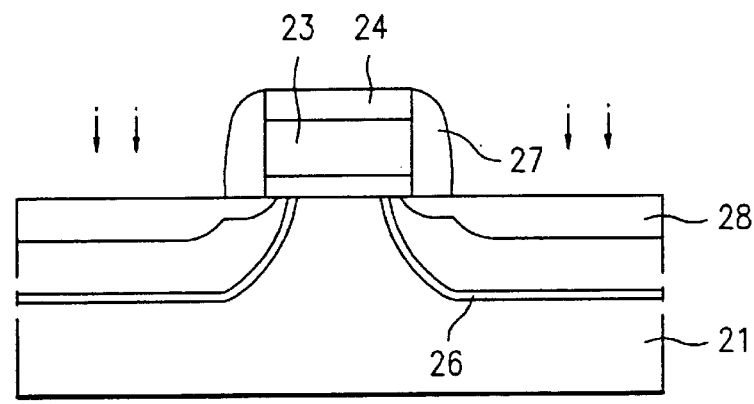

As shown in FIG. 4e, N type heavily doped impurity ions are implanted into both sides of the sidewall insulating film 27 excluding the gate electrode 23 to form a source/drain region 28.

Figure 4F:
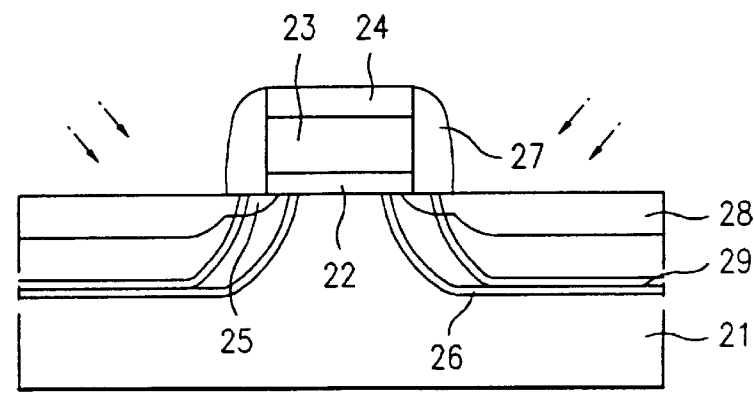

As shown in FIG. 4f, P type impurity ions are tilt implanted into both sides of the sidewall insulating film 27 at an angle between 0° and 60° to form a second halo region 29.

At this time, the second halo region 29 is formed to surround the source/drain region 28. The second halo region 29 is not formed at a lower portion of the LDD region 25. This prevents punch through which may occur at the lower portion of the source/drain region 28 and the LDD region 25.

The second halo region 29 may be formed by tilt ion implantation without forming the sidewall insulating film 27 after forming the insulating film.

The first halo region 26 may be formed before the formation of the LDD region 25. The second halo region 29 may be formed before the formation of the source/drain region 28.

The P type impurity ions are either B or BF2. The N type impurity ions are either P or As.

The semiconductor device and the method for fabricating the same according to the present invention have the following advantages.

First, since the first and second halo regions does not overlap each other, punch through does not occur at the lower edge portions of the LDD region and the source/drain region so that the current driving force can be improved.

In general, if the length of the channel becomes shorter extremely due to high packing density of the device, reverse-short channel effect which increases threshold voltage of the device occurs. In the present invention, such reverse-short channel effect can be avoided by adjustment of doping density of the second halo region.

It will be apparent to those skilled in the art that various modifications and variations can be made in the semiconductor device and the method for fabricating the same of the present invention without departing from the spirit or scope of the invention. Thus, it is intended that the present invention cover the modifications and variations of the invention provided they come within the scope of the appended claims and their equivalents.

What is claimed is:

1. A semiconductor device comprising:
   a first conductivity type semiconductor substrate;
   a gate electrode formed on the semiconductor substrate;
   a sidewall insulating film formed at both sides of the gate electrode;
   a second conductivity type first lightly doped impurity region and a second conductivity type second heavily doped impurity region formed in the semiconductor substrate at both sides of the gate electrode;
   a first conductivity type first impurity region for surrounding the second conductivity type first lightly doped impurity region; and
   a first conductivity type second impurity region for surrounding the second conductivity type heavily doped impurity region, wherein the first conductivity type first impurity region has a maximum depth substantially the same as a maximum depth of the first conductivity type second impurity region.

2. The semiconductor device as claimed in claim 1, wherein the second conductivity type first lightly doped impurity region extends below the gate electrode to be longer than the second type second heavily doped impurity region.

3. The semiconductor device as claimed in claim 1, wherein the first conductivity type first impurity region is f to surround the second conductivity type second heavily doped impurity region and some portion of the second conductivity type first lightly doped impurity region.

4. The semiconductor device as claimed in claim 1, wherein the first conductivity type first impurity region and the first conductivity type second impurity region are P type impurity ion regions, and the second conductivity type first impurity region and the second conductivity type second impurity region are N type impurity ion regions.

5. The semiconductor device as claimed in claim 4, wherein the P type impurity ions are either B or BF2, and the N type impurity ions are either P or As.

* * * * *

UNITED STATES PATENT AND TRADEMARK OFFICE
CERTIFICATE OF CORRECTION

PATENT NO. : 6,078,081
DATED : June 20, 2000
INVENTOR(S) : Sang Don Lee

It is certified that error appears in the above-identified patent and that said Letters Patent is hereby corrected as shown below:

Column 6,
Line 9, delete "f" and insert -- formed --.

Signed and Sealed this

Fourth Day of June, 2002

Attest:

Attesting Officer

JAMES E. ROGAN
Director of the United States Patent and Trademark Office